(12) United States Patent
Kuo et al.

(10) Patent No.: US 11,586,230 B2
(45) Date of Patent: Feb. 21, 2023

(54) SYSTEMS AND METHODS FOR AUTOMATIC CONCENTRATION CONTROL

(71) Applicant: Taiwan Semiconductor Manufacturing Co., Ltd., Hsinchu (TW)

(72) Inventors: Cheng-Hao Kuo, Hsinchu (TW); Chia-Lun Chen, Taichung (TW); Chung-Hao Hu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 30 days.

(21) Appl. No.: 16/932,012

(22) Filed: Jul. 17, 2020

(65) Prior Publication Data

US 2021/0200250 A1 Jul. 1, 2021

Related U.S. Application Data

(60) Provisional application No. 62/954,352, filed on Dec. 27, 2019.

(51) Int. Cl.
*G05D 11/13* (2006.01)
*H01L 21/67* (2006.01)
*G05D 7/06* (2006.01)

(52) U.S. Cl.
CPC ......... *G05D 11/135* (2013.01); *G05D 7/0635* (2013.01); *G05D 11/138* (2013.01); *H01L 21/67023* (2013.01); *H01L 21/67017* (2013.01); *H01L 21/67253* (2013.01)

(58) Field of Classification Search
CPC ........ Y10T 137/2506; Y10T 137/2509; G05D 11/135; G05D 11/138; H01L 21/67023; H01L 21/67017; H01L 21/67253
USPC ...................................... 137/92, 93
See application file for complete search history.

(56) References Cited

U.S. PATENT DOCUMENTS

| | | | | |
|---|---|---|---|---|
| 4,724,795 A | * | 2/1988 | Levine | G05D 11/138 118/425 |
| 5,924,794 A | * | 7/1999 | O'Dougherty | G05D 11/138 366/136 |
| 7,976,718 B2 | * | 7/2011 | Kashkoush | H01L 21/31111 216/103 |
| 8,575,571 B2 | | 11/2013 | Haibara et al. | |

(Continued)

FOREIGN PATENT DOCUMENTS

| | | |
|---|---|---|
| CN | 1774290 A | 5/2006 |
| CN | 1914710 A | 2/2007 |

(Continued)

*Primary Examiner* — William M McCalister
(74) *Attorney, Agent, or Firm* — Seed IP Law Group LLP (57) ABSTRACT

Semiconductor processing systems and methods are provided in which an amount or concentration of a chemical in a chemical mixture contained in a tank is automatically controlled based on a sensed properties of the chemical mixture. In some embodiments, a semiconductor processing system includes a processing tank that is configured to contain a chemical mixture. A chemical sensor is configured to sense one or more properties of the chemical mixture. The system further includes an electrically controllable valve that is configured to adjust an amount of the first chemical in the chemical mixture based on the sensed one or more properties of the chemical mixture.

20 Claims, 5 Drawing Sheets

(56) References Cited

U.S. PATENT DOCUMENTS

| | | | |
|---|---|---|---|
| 9,725,343 B2 | 8/2017 | Coulter | |
| 2002/0102851 A1* | 8/2002 | Yokomizo | H01L 21/31111 |
| | | | 438/689 |
| 2002/0154567 A1* | 10/2002 | Husher | B01F 35/2132 |
| | | | 366/132 |
| 2005/0286340 A1* | 12/2005 | Urquhart | B01F 35/82 |
| | | | 366/136 |
| 2007/0109912 A1* | 5/2007 | Urquhart | G05D 11/138 |
| | | | 366/136 |
| 2007/0119816 A1* | 5/2007 | Urquhart | H01L 21/6715 |
| | | | 216/84 |
| 2009/0141583 A1* | 6/2009 | Fanjat | H01L 21/6715 |
| | | | 366/140 |
| 2015/0318224 A1* | 11/2015 | Kashkoush | H01L 21/67086 |
| | | | 438/5 |
| 2017/0239840 A1* | 8/2017 | Adams | B29C 48/11 |
| 2021/0200250 A1* | 7/2021 | Kuo | G05D 11/138 |

FOREIGN PATENT DOCUMENTS

| | | |
|---|---|---|
| CN | 101489660 A | 7/2009 |
| CN | 102446790 A | 5/2012 |
| CN | 103094146 A | 5/2013 |
| EP | 0 970 744 A2 | 1/2000 |
| TW | 201128697 A1 | 8/2011 |
| WO | 01/09620 A1 | 2/2001 |
| WO | 2009/069090 A2 | 6/2009 |
| WO | 2019/058488 A1 | 3/2019 |

* cited by examiner

SYSTEMS AND METHODS FOR AUTOMATIC CONCENTRATION CONTROL

BACKGROUND

Wet chemical process tanks are used in various semiconductor fabrication processes. For example, chemical process tanks are used for etching semiconductor wafers or structures, for removing etch residues, and for removing photoresist from semiconductor wafers or structures. The wet chemicals contained within the process tanks often contain a mixture of two or more chemicals.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application relates to semiconductor processing systems and methods having an electrically controllable valve for automatically adjusting an amount or concentration of a chemical (such as water) in a chemical mixture within a processing tank.

In some wet chemical process systems, one or more valves, such as chemical concentrations valves or the like, are included which allow for adjustment of an amount of the chemicals flowing into the chemical mixture contained within the process tank. Moisture or water content within a chemical mixture in a semiconductor processing tank is typically adjusted by manual operation of a valve that controls the water content in the mixture. Typically, an operator manually checks the chemical concentration(s) by a chemical concentration meter, such as a chemical concentration meter commercially available from Horiba Semiconductor. When the valve is adjusted, the moisture or water content is monitored to determine whether the adjustment was correct or proper. Once the operator finds the concentration is unacceptable (e.g., trend up or down), the operator manually adjusts the valves in order to regulate a flow of the chemicals into the process tank. This is costly in terms of manpower and is time intensive.

In various embodiments, the present disclosure provides systems and methods in which a chemical sensor senses one or more properties of a chemical (e.g., water or moisture) in a chemical mixture within a processing tank. An electrically controllable valve is included and is utilized to automatically adjust an amount of the chemical in the chemical mixture based on the sensed properties of the chemical in the chemical mixture.

In some embodiments, the chemical mixture in the processing tank is an etch residue remover or a photoresist stripper for removing residue or photoresist, and the chemical sensor senses an amount or concentration of water or moisture in the chemical mixture. The amount of moisture or water in the chemical mixture may be precisely controlled due to the water content monitoring and automatic concentration adjustments facilitated by embodiments of the disclosure.

Figure 1:
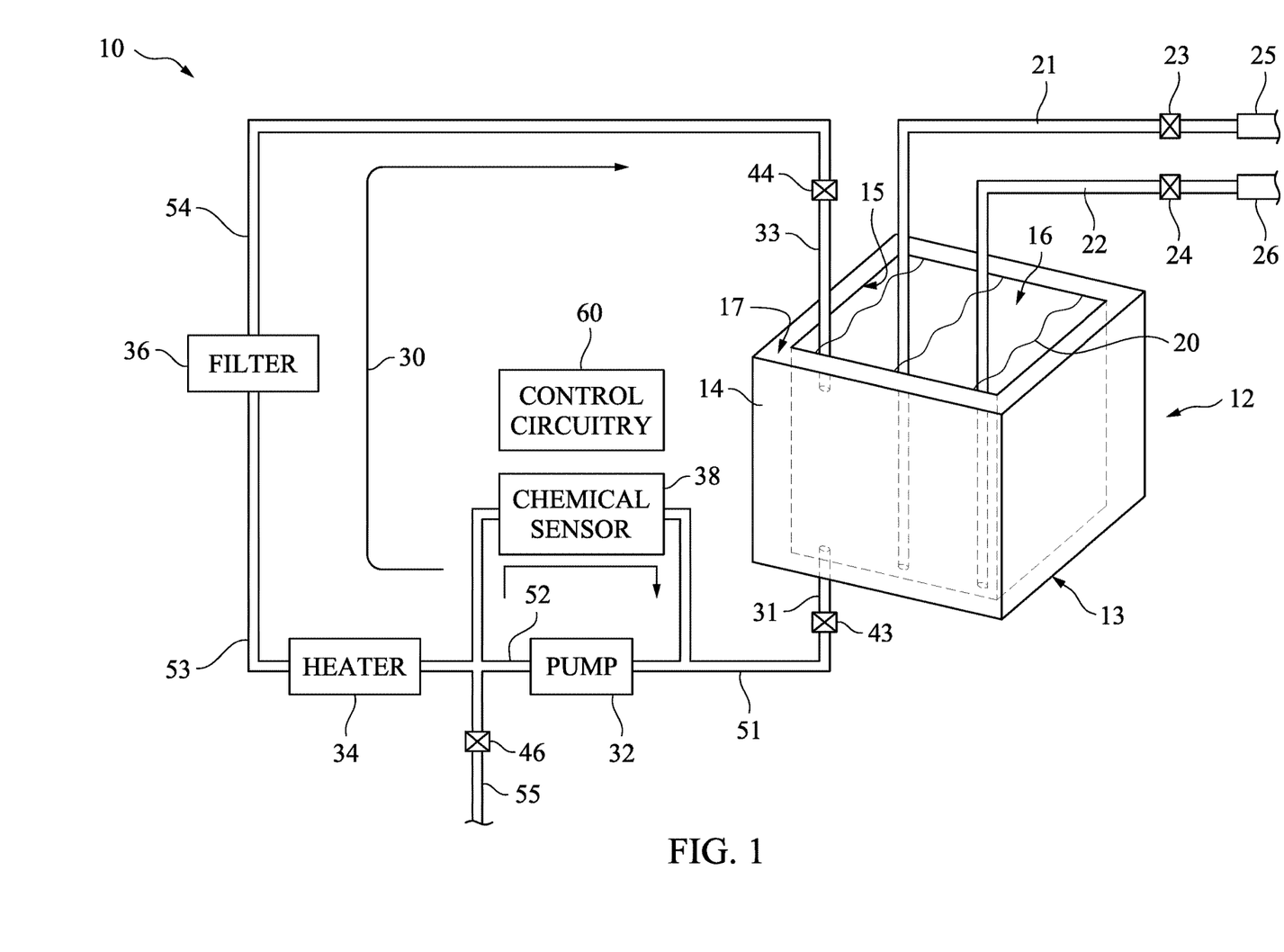
FIG. 1 is a schematic diagram illustrating an automatic concentration control system, in accordance with some embodiments.

FIG. 1 is a schematic diagram illustrating an automatic concentration control system 10 (which may be referred to herein as system 10) for use, for example, in semiconductor processing, in accordance with one or more embodiments of the present disclosure. The automatic concentration control system 10 illustrated in FIG. 1 may be used, for example, with or in conjunction with any semiconductor processing tool, such as a cleaning tool, a photoresist removal tool, an etching-related semiconductor processing tool, such as a wet etching tool, or the like; however, embodiments of the present disclosure are not limited thereto. In various embodiments, the automatic concentration control system 10 may be any system having one or more tanks containing a chemical mixture in which automatic concentration control is utilized to control concentrations of the chemical mixture.

The automatic concentration control system 10 includes a tank 12. The tank 12 includes a bottom wall 13 and outer side walls 14 extending upward from the bottom wall 13. In some embodiments, the tank 12 includes inner side walls 15 which extend upward from the bottom wall 13 and which are spaced laterally inward with respect to the outer side walls 14. In some embodiments, the inner side walls 15 define a tank interior 16 configured to hold a chemical mixture 20.

The tank 12 is illustrated in FIG. 1 as having a substantially cuboid shape; however, embodiments are not limited thereto. In various embodiments, the tank 12 may have any shape suitable to contain or hold a volume of a chemical mixture 20, including, for example, a cylindrical shape, or any other shape.

The chemical mixture 20 may be any chemical mixture, for example, any liquid chemical mixture that may be utilized for semiconductor processing, such as for cleaning or removing photoresist from a semiconductor wafer. In some embodiments, the tank 12 contains or is configured to contain a liquid chemical mixture 20 for removing photoresist. In some embodiments, the chemical mixture 20 is an etch residue remover and positive photoresist stripper, which may be an amine-based liquid chemical mixture, hydrofluoric (HF) acid-based liquid chemical mixture, or any other liquid chemical mixture suitable for use in semiconductor processing.

In some embodiments, the tank 12 includes an overflow space 17 between the inner side walls 15 and the outer side walls 14. The overflow space 17 accommodates the chemical mixture 20 in the event some of the chemical mixture 20 overflows the tank interior 16, thereby preventing spillage of the chemical mixture 20 outside of the tank 12.

The system 10 includes a first inlet conduit 21 and a second inlet conduit 22. A first liquid may be introduced into the tank interior 16 via the first inlet conduit 21, and a second liquid may be introduced into the tank interior 16 via the second inlet conduit 22. A first inlet valve 23 is communicatively coupled between a first liquid supply 25 and the first inlet conduit 21, and a second inlet valve 24 is communicatively coupled between a second liquid supply 26 and the second inlet conduit 22. One or more pumps (not shown) may be included in the system 10 for pumping and supplying flows of the first and second liquids into the tank 12.

Each of the first and second liquids may be constituent liquids of the chemical mixture 20, and in some embodiments the chemical mixture 20 is made up of a homogenous mixture of the first and second liquids. In some embodiments, the first liquid includes a liquid chemical for removing photoresist. In some embodiments, the first liquid includes an etch residue remover or positive photoresist stripper liquid chemical, which may be an amine-based liquid chemical, hydrofluoric (HF) acid-based liquid chemical, or any other liquid chemical suitable for use in semiconductor processing. In some embodiments, the second fluid is water or deionized (DI) water.

An end of the first inlet conduit 21 is positioned in the tank interior 16, and in some embodiments, the end of the first inlet conduit 21 is positioned adjacent the bottom wall 13 of the tank 12. Similarly, an end of the second inlet conduit 22 is positioned in the tank interior 16, and in some embodiments, the end of the second inlet conduit 22 is positioned adjacent the bottom wall 13 of the tank 12.

The system 10 further includes a recirculation loop 30 through which the chemical mixture 20 may be recirculated from an outlet conduit 31 that is communicatively coupled to the tank interior 16 back into the tank interior 16 through a third inlet conduit 33. In some embodiments, an end of the outlet conduit 31 is positioned adjacent the bottom wall 13 of the tank 12. In some embodiments, the recirculation loop 30 mixes the chemical mixture 20, for example, by recirculating and mixing the first and second liquids of the chemical mixture 20 through the recirculation loop 30.

In some embodiments, the recirculation loop 30 includes a pump 32, a heater 34, and a filter 36 communicatively coupled between the outlet conduit 31 and the third inlet conduit 33. Additionally, the recirculation loop 30 may include an outlet valve 43 and a third inlet valve 44. A plurality of recirculation loop conduits 51, 52, 53, 54 are included in the recirculation loop 30 and communicatively couple components of the recirculation loop 30 to one another, as shown in FIG. 1.

In some embodiments, the pump 32 is communicatively coupled to the outlet valve 43 via a first recirculation loop conduit 51, and the heater 34 is communicatively coupled to an outlet of the pump 32 via a second recirculation loop conduit 52. In some embodiments, the filter 36 is communicatively coupled to an outlet of the heater 34 via a third recirculation loop conduit 53, and an outlet of the filter 36 is communicatively coupled to the third inlet valve 44 via a fourth recirculation loop conduit 54.

In operation, the pump 32 pumps a flow of the chemical mixture 20 from the tank interior 16 through the outlet conduit 31, the pump 32, the heater 34, the filter 36, the plurality of recirculation loop conduits 51, 52, 53, 54, and back into the tank interior 16 through the third inlet conduit 33. In this manner, the liquid components of the chemical mixture 20 (e.g., the first and second liquids) separately added to the tank interior 16 through the first and second inlet conduits 21, 22 are thoroughly mixed via the recirculation loop 30 to provide a substantially homogenous liquid chemical mixture 20.

In some embodiments, the filter 36 operably filters out contaminants, unwanted particles, or the like which may be present in the chemical mixture 20 as it is pumped through the recirculation loop 30. The filter 36 may be any suitable filter for filtering such contaminants or unwanted particles from the chemical mixture 20 and the filter characteristics may be variously selected based on, for example, a size, type, chemical composition, features, or the like of contaminants or particles that are to be filtered out of or otherwise removed from the chemical mixture 20.

In some embodiments, the heater 34 heats the chemical mixture 20 to a selected temperature as the chemical mixture 20 is pumped through the recirculation loop 30. The heater 34 may be any suitable heater for heating the chemical mixture 20, and the chemical mixture 20 may be heated to any selected temperature.

In some embodiments, the system 10 includes a drain valve 46 communicatively coupled between the recirculation loop 30 (e.g., the second recirculation loop conduit 52) and a drain conduit 55. The drain valve 46 is operable to selectively drain some of the chemical mixture 20 flowing through the recirculation loop 30.

The system 10 further includes a chemical sensor 38 and control circuitry 60 that is electrically coupled to the chemical sensor 38. The chemical sensor 38 may be any sensor operable to sense one or more properties of the chemical mixture 20. In some embodiments, the chemical sensor 38 is a chemical concentration monitor operable to sense a concentration of one or both of the first and second liquid chemicals in the chemical mixture 20. In some embodiments, the second liquid is water and the chemical sensor 38 is a chemical concentration monitor operable to sense a concentration of the water in the chemical mixture 20. In some embodiments, the chemical sensor 38 is a chemical concentration monitor that uses ultraviolet (UV) and near-infrared (NIR) absorption spectroscopy to measure multiple components of the chemical mixture 20 in real time.

In some embodiments, the chemical sensor 38 may be configured to sense any indicia associated with water or moisture in the chemical mixture 20. In some embodiments, the chemical sensor 38 may be a water concentration sensor, a water resistance sensor, or the like. In some embodiments, the chemical sensor 38 senses an amount or concentration of water or moisture in the chemical mixture 20 by sensing or detecting electrical properties (e.g., conductivity, resistance, or the like) of the chemical mixture 20. The electrical properties of the chemical mixture 20 can be correlated with an amount of water or moisture in the chemical mixture 20, so that the amount or concentration of water or moisture in the chemical mixture 20 may be determined or estimated based on the electrical properties of the chemical mixture.

The control circuitry 60 receives an output signal from the chemical sensor 38 indicative of a sensed property of the chemical mixture 20. For example, in some embodiments, the output signal received from the chemical sensor 38 indicates a concentration of the second liquid (e.g., water) present in the chemical mixture 20.

In some embodiments, at least one of the first inlet valve 23, the second inlet valve 24, the third inlet valve 44, the outlet valve 43, or the drain valve 46 is an electrically controllable valve that is operable to selectively control or regulate a flow of fluid in the system 10. The control circuitry 60 is electrically or communicatively coupled to the at least one of the first inlet valve 23, the second inlet valve 24, the third inlet valve 44, the outlet valve 43, or the drain valve 46, and the control circuitry 60 is operable to control actuation of the valves based on the output signal from the chemical sensor 38 indicative of the sensed property of the chemical mixture 20.

For example, in some embodiments, the first inlet valve 23 is an electrically controllable valve that is controllable based on a control signal output by the control circuitry 60, and the control circuitry 60 may control an amount of flow of the first liquid through the first inlet valve 23 based on the sensed property of the chemical mixture 20 (e.g., based on a concentration of the first liquid or the second liquid in the chemical mixture 20). Operation of the first inlet valve 23 may thus adjust one or properties of the chemical mixture 20, such as by adjusting a concentration of the first liquid in the chemical mixture 20.

In some embodiments, the second inlet valve 24 is an electrically controllable valve that is controllable based on a control signal output by the control circuitry 60, and the control circuitry 60 may control an amount of flow of the second liquid through the second inlet valve 24 based on the sensed property of the chemical mixture 20 (e.g., based on a concentration of the second liquid in the chemical mixture 20). In some embodiments, the second liquid is water or DI water, and the control circuitry 60 controls an amount of flow of DI water through the second inlet valve 24 and into the tank 12 based on the sensed concentration of water in the chemical mixture 20. Operation of the second inlet valve 24 may thus adjust one or properties of the chemical mixture 20, such as by adjusting a concentration of the second liquid in the chemical mixture 20. For example, by selectively opening the second inlet valve 24, a desired amount of DI water may be introduced into the chemical mixture 20, thereby increasing the concentration of the DI water in the chemical mixture 20.

Similarly, the third inlet valve 44, the outlet valve 43, and the drain valve 46 may be electrically controllable valves that are controllable based on control signals output by the control circuitry 60. The control circuitry 60 may control an amount of the chemical mixture 20 that is recirculated back into the tank 12, for example, by selectively controlling operation of the third inlet valve 44. The control circuitry 60 may control an amount of the chemical mixture 20 that flows into the recirculation loop 30 by selectively controlling operation of the outlet valve 43. The control circuitry 60 may control an amount of the chemical mixture 20 that is drained from the system 10, for example, by selectively controlling operation of the drain valve 46.

In some embodiments, the control circuitry 60 automatically controls the operations of one or more of the first inlet valve 23, the second inlet valve 24, the third inlet valve 44, the outlet valve 43, or the drain valve 46 based on the output signal of the chemical sensor 38 indicative of the sensed property of the chemical mixture 20.

The first inlet valve 23, the second inlet valve 24, the third inlet valve 44, the outlet valve 43, and the drain valve 46 may be selectively controllable to have any position between and including a fully open position and a fully closed position. Accordingly, an amount of flow through any of the first inlet valve 23, the second inlet valve 24, the third inlet valve 44, the outlet valve 43, and the drain valve 46 may be precisely controlled through automatic control provided from the control circuitry 60 based on one or more sensed properties of the chemical mixture 20.

By selective and automatic control of one or more of the first inlet valve 23, the second inlet valve 24, the third inlet valve 44, the outlet valve 43, and the drain valve 46, the chemical mixture 20 may be precisely controlled to have a uniform and consistent chemical composition as may be desired, for example, based on a recipe for a particular semiconductor process to be carried out utilizing the chemical mixture 20.

In some embodiments, the chemical mixture 20 includes some amount of water or moisture, such as DI water, which may be the second liquid in the chemical mixture 20. In some embodiments, an amount of the DI water in the chemical mixture 20 is precisely controlled so that the DI water makes up a desired percentage of the chemical mixture 20. The amount of the DI water in the chemical mixture 20 may be selected as desired, for example, depending on a particular semiconductor process to be performed by the chemical mixture 20. In some embodiments, the amount of the second liquid (e.g., DI water) is maintained at a level within 1% deviation of a threshold level by the automatic control of the one or more of the first inlet valve 23, the second inlet valve 24, the third inlet valve 44, the outlet valve 43, and the drain valve 46. The threshold level may be determined based on the particular semiconductor process to be performed by the chemical mixture 20 or by a recipe for use in the semiconductor process to be performed.

In some embodiments, the amount of the second liquid (e.g., DI water) is maintained at a level within 0.5% deviation of the threshold level. In some embodiments, the amount of the second liquid (e.g., DI water) is maintained at a level within 0.1% deviation of the threshold level. The maintenance of the amount of the second liquid in the chemical mixture 20 is automatically controlled by operation of the various valves in the system 10, based on feedback provided from the chemical sensor 38 to the control circuitry 60.

In some embodiments, the first liquid includes an etch residue remover or positive photoresist stripper liquid chemical, which may be an amine-based liquid chemical, hydrofluoric (HF) acid-based liquid chemical, or any other liquid chemical suitable for use in semiconductor processing. In some embodiments, the second fluid is water or deionized (DI) water Further details of the control circuitry 60 will be described later herein, for example, with respect to FIG. 4.

Figure 2:
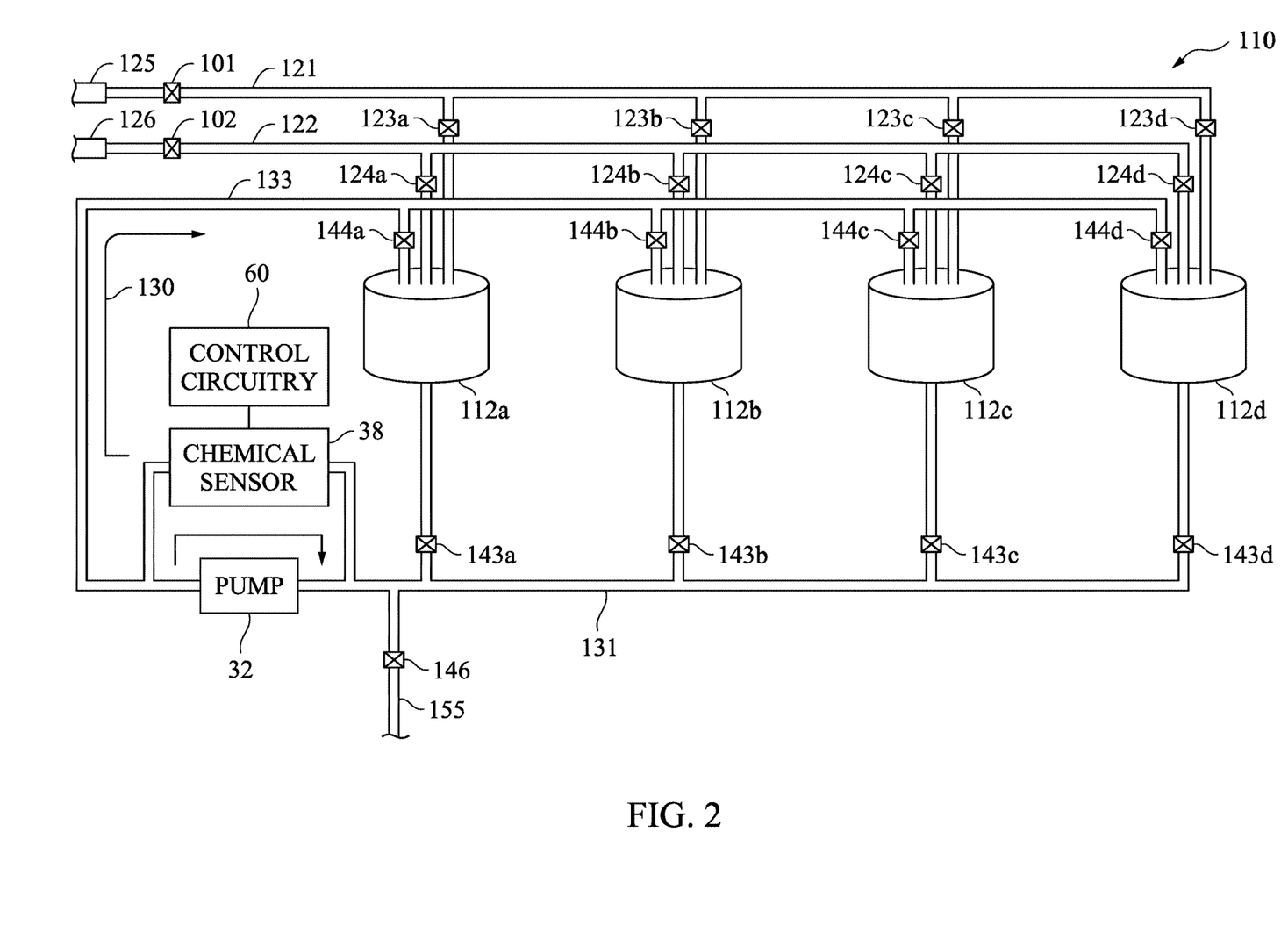
FIG. 2 is a schematic diagram illustrating another automatic concentration control system, in accordance with some embodiments.

FIG. 2 is a schematic diagram illustrating an automatic concentration control system 110 for use, for example, in semiconductor processing, in accordance with one or more embodiments of the present disclosure. The automatic concentration control system 110 illustrated in FIG. 2 may be used, for example, with or in conjunction with any semiconductor processing tool, such as a cleaning tool, a photoresist removal tool, an etching-related semiconductor processing tool, such as a wet etching tool, or the like; however, embodiments of the present disclosure are not limited thereto. In various embodiments, the automatic concentration control system 110 may be any system having one or more tanks containing a chemical mixture in which automatic concentration control is utilized to control concentrations of the chemical mixture.

The automatic concentration control system 110 shown in FIG. 2 may be substantially the same as the automatic concentration control system 10 shown and described with respect to FIG. 1; however, one difference is that the system 110 of FIG. 2 includes a plurality of tanks 112a-112d which contain the chemical mixture 20.

For example, as shown in FIG. 2, in some embodiments, the system 110 may include four or more tanks 112a, 112b, 112c, 112d. Each of the tanks may hold a quantity of a chemical mixture 20, such as a liquid chemical mixture that may be utilized for semiconductor processing, such as for cleaning or removing photoresist from a semiconductor wafer. In some embodiments, the tanks 112a-112d contain or are configured to contain a liquid chemical mixture for removing photoresist. In some embodiments, the tanks 112a-112d contain an etch residue remover and positive photoresist stripper, which may be an amine-based liquid chemical mixture, hydrofluoric (HF) acid-based liquid chemical mixture, or any other liquid chemical mixture suitable for use in semiconductor processing.

The tanks 112a-112d of the system 110 may be substantially the same as the tank 12 shown and described with respect to FIG. 1, and the tanks 112a-112d may include any of the features and functionalities previously described herein with respect to the tank 12. While the tanks 112a-112d are illustrated as being cylindrically shaped tanks, in various embodiments, the tanks 112a-112d may be have any shape suitable to hold a volume of fluid, such as the chemical mixture 20.

The system 110 includes a first inlet conduit 121 and a second inlet conduit 122. A first liquid may be introduced into the interior of the tanks 112a-112d via the first inlet conduit 121, and a second liquid may be introduced into the interior of the tanks 112a-112d via the second inlet conduit 122. A first supply valve 101 is communicatively coupled between a first liquid supply 125 and the first inlet conduit 121, and a second supply valve 102 is communicatively coupled between a second liquid supply 126 and the second inlet conduit 122.

The system 110 includes a plurality of first inlet valves 123a-123d, and each of the first inlet valves 123a-123d is communicatively coupled between the first inlet conduit 121 and an interior of a respective tank 112a-112d. The system 110 further includes a plurality of second inlet valves 124a-124d, and each of the second inlet valves 124a-124d is communicatively coupled between the second inlet conduit 122 and the interior of a respective tank 112a-112d.

Each of the first and second liquids may be constituent liquids of the chemical mixture 20, which may be the same as previously described herein with respect to FIG. 1. In some embodiments, the first liquid includes a liquid chemical for removing photoresist. In some embodiments, the first liquid includes an etch residue remover or positive photoresist stripper liquid chemical, which may be an amine-based liquid chemical, hydrofluoric (HF) acid-based liquid chemical, or any other liquid chemical suitable for use in semiconductor processing. In some embodiments, the second fluid is water or deionized (DI) water.

The system 110 further includes a recirculation loop 130 through which the chemical mixture 20 may be recirculated from an outlet conduit 131 that is communicatively coupled to the interiors of the tanks 112a-112d back into the interiors of the tanks 112a-112d through a third inlet conduit 133. The recirculation loop 130 may be substantially the same as the recirculation loop 30 shown and described with respect to FIG. 1, and the recirculation loop 130 may include any of the features and functionalities previously described herein with respect to the recirculation loop 30.

As shown in FIG. 2, the recirculation loop 130 includes the pump 32 and sensor 38, which are previously described herein with respect to FIG. 1. In some embodiments, the recirculation loop 130 may further include a heater and a filter, for example, as shown and described with respect to FIG. 1.

The system 110 includes a plurality of outlet valves 143a-143d, each of which is communicatively coupled between the interior of a respect tank 112a-112d and the outlet conduit 131. Additionally, the recirculation loop 130 may include a plurality of third inlet valves 144a-144d, each of which is communicatively coupled between the third inlet conduit 133 and the interior of a respective tank 112a-112d.

The pump 32 may be substantially the same as the pump 32 previously described herein with respect to FIG. 1. In operation, the pump 32 pumps a flow of the chemical mixture 20 from the interior of the tanks 112a-112d through the outlet conduit 131, through the pump 32, and back into the interior of the tanks 112a-112d through the third inlet conduit 133. In this manner, the liquid components of the chemical mixture 20 (e.g., the first and second liquids) separately added to the tanks 112a-112d through the first and second inlet conduits 121, 122 are thoroughly mixed via the recirculation loop 130 to provide a substantially homogenous liquid chemical mixture 20.

Although not shown in FIG. 2, in some embodiments, the system 110 may include additional components, such as a heater and filter as shown for example in FIG. 1. For example, a heater and a filter may be included within the recirculation loop 130 and may be communicatively coupled to the pump 32 so that the chemical mixture 20 is pumped through the heater and the filter during operation.

In some embodiments, the system 110 includes a drain valve 146 communicatively coupled between the recirculation loop 130 (e.g., the outlet conduit 131) and a drain conduit 155. The drain valve 146 may be substantially the same as the drain valve 46 described with respect to FIG. 1, and the drain valve 146 is operable to selectively drain some of the chemical mixture 20 flowing through the recirculation loop 130. In some embodiments, a plurality of drain valves 146 may be included in the system 110, for example, with each drain valve 146 communicatively coupled between an outlet of a respective tank 112a-112d and the drain conduit 155. In such embodiments, individual draining of each of the tanks 112a-112d may be controlled, for example, by selective actuation of the drain valves 146.

The system 110 further includes a chemical sensor 38 and control circuitry 60 that is electrically coupled to the chemical sensor 38. The chemical sensor 38 may be the same as the chemical sensor 38 previously described with respect to FIG. 1, and the chemical sensor 38 any sensor operable to sense one or more properties of the chemical mixture 20. In some embodiments, the chemical sensor 38 is a chemical concentration monitor operable to sense a concentration of one or both of the first and second liquid chemicals in the chemical mixture 20. In some embodiments, the second liquid is water and the chemical sensor 38 is a chemical concentration monitor operable to sense a concentration of the water in the chemical mixture 20.

In some embodiments, the chemical sensor 38 is a chemical concentration monitor that uses ultraviolet (UV) and near-infrared (NIR) absorption spectroscopy to measure multiple components of the chemical mixture 20 in real time.

The control circuitry 60 may be substantially the same as the control circuitry 60 previously described with respect to FIG. 1, and the control circuitry 60 receives an output signal from the chemical sensor 38 indicative of a sensed property of the chemical mixture 20. For example, in some embodiments, the output signal received from the chemical sensor 38 indicates a concentration of the second liquid (e.g., water) present in the chemical mixture 20.

In some embodiments, at least one of the first supply valve 101, the second supply valve 102, the first inlet valves 123a-123d, the second inlet valves 124a-124d, the third inlet valves 144a-144d, the outlet valve 143, or the drain valve 146 is an electrically controllable valve that is operable to selectively control or regulate a flow of fluid in the system 10. The control circuitry 60 is electrically or communicatively coupled to the at least one of the first supply valve 101, the second supply valve 102, the first inlet valves 123a-123d, the second inlet valves 124a-124d, the third inlet valves 144a-144d, the outlet valve 143, or the drain valve 146, and the control circuitry 60 is operable to control actuation of the valves based on the output signal from the chemical sensor 38 indicative of the sensed property of the chemical mixture 20.

In some embodiments, the control circuitry 60 automatically controls the operations of one or more of the first supply valve 101, the second supply valve 102, the first inlet valves 123a-123d, the second inlet valves 124a-124d, the third inlet valves 144a-144d, the outlet valve 143, or the drain valve 146 based on the output signal of the chemical sensor 38 indicative of the sensed property of the chemical mixture 20.

The first supply valve 101, the second supply valve 102, the first inlet valves 123a-123d, the second inlet valves 124a-124d, the third inlet valves 144a-144d, the outlet valve 143, and the drain valve 146 may be selectively controllable to have any position between and including a fully open position and a fully closed position. Accordingly, an amount of flow through any of the first supply valve 101, the second supply valve 102, the first inlet valves 123a-123d, the second inlet valves 124a-124d, the third inlet valves 144a-144d, the outlet valve 143, and the drain valve 146 may be precisely controlled through automatic control provided from the control circuitry 60 based on one or more sensed properties of the chemical mixture 20.

By selective and automatic control of one or more of the first supply valve 101, the second supply valve 102, the first inlet valves 123a-123d, the second inlet valves 124a-124d, the third inlet valves 144a-144d, the outlet valve 143, and the drain valve 146, the chemical mixture 20 may be precisely controlled to have a uniform and consistent chemical composition as may be desired, for example, based on a recipe for a particular semiconductor process to be carried out utilizing the chemical mixture 20.

Figure 3:
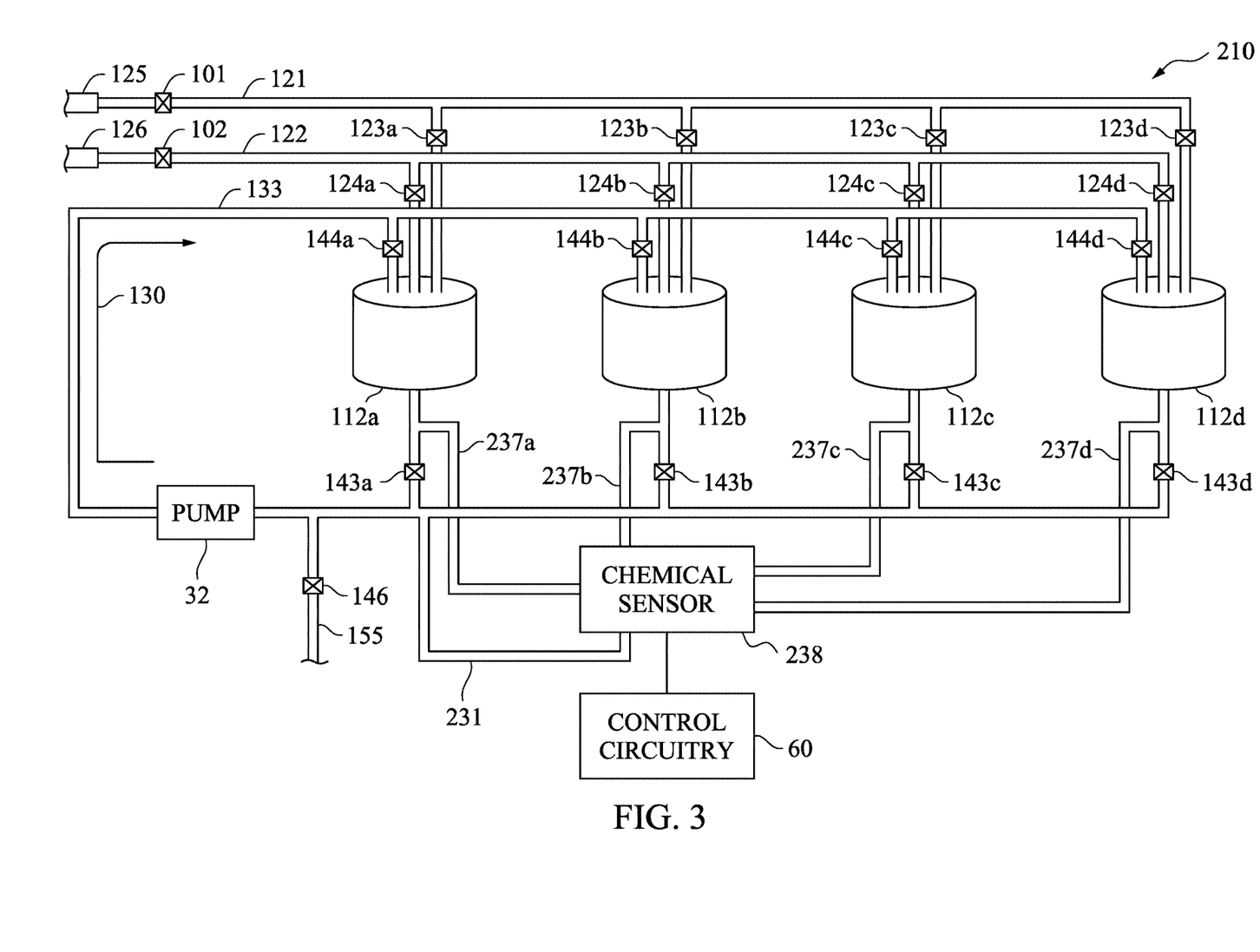
FIG. 3 is a schematic diagram illustrating yet another automatic concentration control system, in accordance with some embodiments.

FIG. 3 is a schematic diagram illustrating an automatic concentration control system 210 for use, for example, in semiconductor processing, in accordance with one or more embodiments of the present disclosure. The automatic concentration control system 210 illustrated in FIG. 3 may be used, for example, with or in conjunction with any semiconductor processing tool, such as a cleaning tool, a photoresist removal tool, an etching-related semiconductor processing tool, such as a wet etching tool, or the like; however, embodiments of the present disclosure are not limited thereto. In various embodiments, the automatic concentration control system 310 may be any system having one or more tanks containing a chemical mixture in which automatic concentration control is utilized to control concentrations of the chemical mixture.

The automatic concentration control system 210 shown in FIG. 3 may be substantially the same as, and may include any of the features and functionalities of, the automatic concentration control system 110 shown and described with respect to FIG. 2. The difference between the system 210 shown in FIG. 3 and the system 110 shown in FIG. 2 is that the system 210 includes a chemical sensor 238 that is separately communicatively coupled to each of the tanks 112a-112d. For example, the chemical sensor 238 may be communicatively coupled to the interiors of each of the tanks 112a-112d via respective chemical sensing channels 237a-237d. The chemical sensing channels 237a-237d thus provide a flow of the respective chemical mixtures in each of the tanks 112a-112d to the chemical sensor 238. In some embodiments, the chemical sensor 238 has a plurality of channels through which chemicals may be separately received and analyzed. In this way, the chemical mixture 20 in each of the tanks 112a-112d may be separately analyzed by the chemical sensor 238, the control circuitry 60 may receive output signals associated with each of the plurality of channels of the chemical sensor 238, and each of the output signals may be indicative of a sensed property of the chemical mixture 20 in a particular one of the tanks 112a-112d.

A sensor outlet conduit 231 may be communicatively coupled between an outlet of the chemical sensor 238 and the outlet conduit, so the chemical mixture 20 that is received by the chemical sensor 238 (e.g., via the chemical sensing channels 237a-237d) may be returned after analysis by the chemical sensor 238 back into the recirculation loop 130.

The control circuitry 60 may thus independently automatically control the various valves (see FIG. 2) of the system 210 based on one or more sensed properties of the chemical mixture 20 (e.g., as sensed by plurality of channels of the chemical sensor 238).

Figure 4:
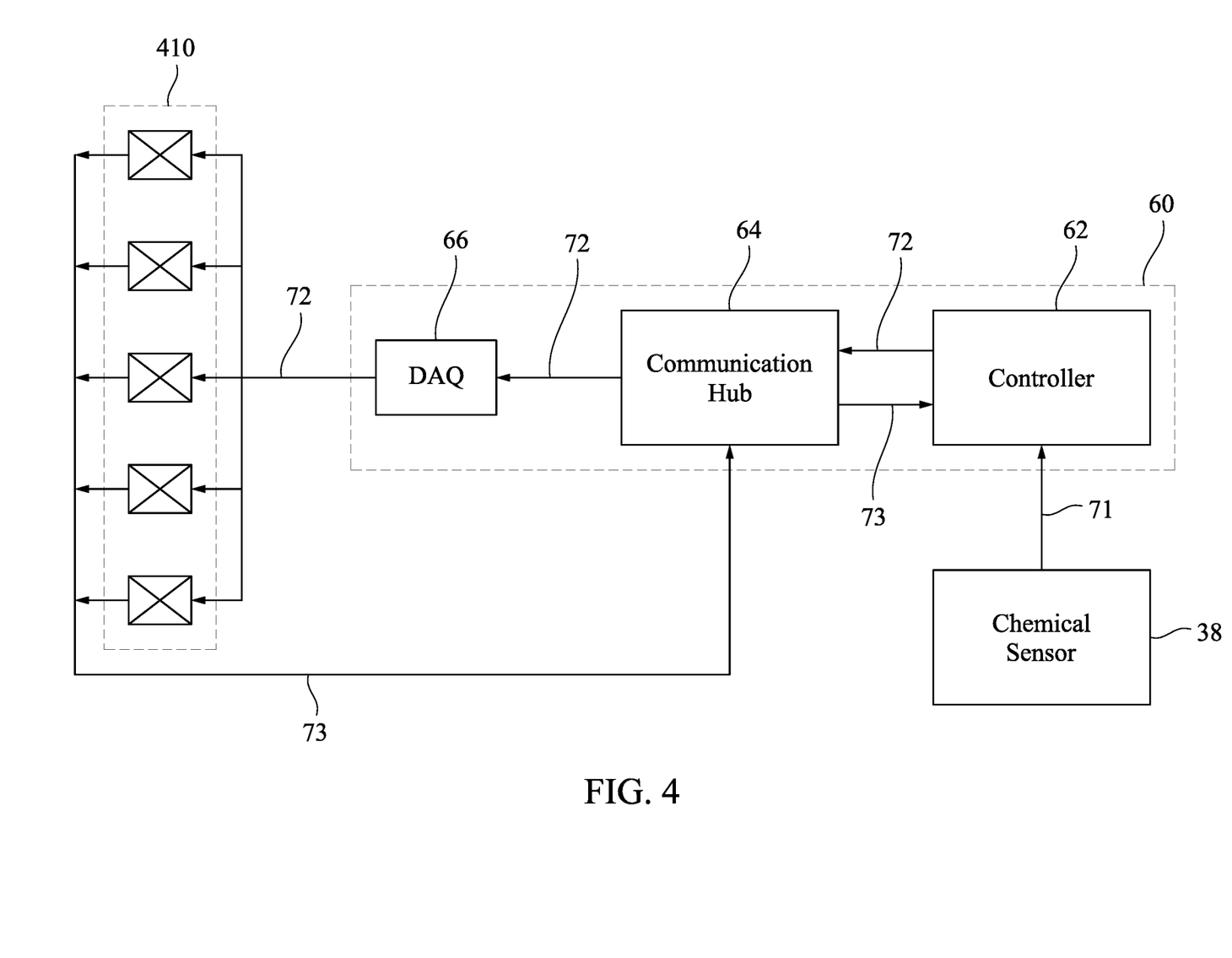
FIG. 4 is a schematic diagram illustrating further details of control circuitry which may be included in the automatic concentration control systems of any of FIGS. 1 through 3, in accordance with some embodiments.

FIG. 4 is a schematic diagram illustrating further details of the control circuitry 60, in accordance with one or more embodiments of the present disclosure.

As shown in FIG. 4, the control circuitry 60 may include a controller 62, a communications hub 64, and data acquisition (DAQ) circuitry 66.

The controller 62 may include or be executed by a computer processor, a microprocessor, a microcontroller, or the like, configured to perform the various functions and operations described herein with respect to the controller. For example, the controller 62 may be or include a computer processor selectively activated or reconfigured by a stored computer program, or may be a specially constructed computing platform for carrying out the features and operations described herein. In some embodiments, the controller 62 may be configured to execute software instructions stored in any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The controller 62 is communicatively coupled to the chemical sensor 38. The chemical sensor 38 may be any of the chemical sensors previously described herein. In some embodiments, the chemical sensor 38 may be configured to sense a plurality of channels of the chemical mixture, for example, as described with respect to FIG. 2.

The controller 62 receives output signals 71 from the chemical sensor 38, and the output signals are indicative of a sensed property of the chemical mixture 20. For example, in some embodiments, the output signals 71 indicate a concentration of a chemical, such as a second liquid (e.g., water), present in the chemical mixture 20. The controller 62 controls operations of the electrically controllable valve based on the sensed property of the chemical mixture 20.

Based on the sensed property of the chemical mixture 20, the controller 62 determines adjustments of one or more electrically controllable valves 410. The one or more electrically controllable valves 410 may include any of the valves previously described herein, such as any of the first inlet valve 23, the second inlet valve 24, the third inlet valve 44, the outlet valve 43, or the drain valve 46 (see FIG. 1), or any of the first supply valve 101, the second supply valve 102, the first inlet valves 123*a*-123*d*, the second inlet valves 124*a*-124*d*, the third inlet valves 144*a*-144*d*, the outlet valve 143, and the drain valve 146 (see FIG. 2).

In some embodiments, the controller 62 outputs one or more valve control signals 72 which control opening or closing of the electrically controllable valves 410, and the valve control signals 72 are based on the output signals 71 received from the chemical sensor 38. The valve control signals 72 may be separately generated and separately output for controlling any one of the electrically controllable valves 410. In some embodiments, the controller 62 outputs one or more valve control signals 72 which refers to open or close time count(s) of opening or closing the electrically controllable valves 410, and the valve control signals 72.

In some embodiments, the communication hub 64 receives the valve control signals 72 and provides the valve control signals 72 to the DAQ circuitry 66. The communication hub 64 may be or include any suitable electrical circuitry for receiving the valve control signals 72 and providing the valve control signals 72 to the DAQ circuitry 66. In some embodiments, the communication hub 64 includes circuitry configured to read information associated with the valve control signals 72 which indicates a particular one of the electrically controllable valves 410 that is to be adjusted, and to route a portion of the valve control signals 72 for controlling the particular electrically controllable valve 410 to an appropriate channel of the DAQ circuitry 66 that is utilized for controlling the particular electrically controllable valve 410.

The DAQ circuitry 66 may be or include any suitable electrical circuitry for receiving the valve control signals 72 from the communication hub 64 and controlling the electrically controllable valves 410 based on the received valve control signals 72. In some embodiments, the DAQ circuitry 66 routes the valve control signals 72 received from the communication hub 64 to the appropriate electrically controllable valve 410, thereby controlling operation of the electrically controllable valve 410.

In some embodiments, one or both of the communication hub 64 and the DAQ circuitry 66 includes electrical or communications components for processing the valve control signals 72 received from the controller 62 and for transmitting the processed control signals to the electrically controllable valves 410. In some embodiments, the electrically controllable valves 410 may be an electromagnetic valve, or any other type of valve that is controllable based on a received electrical control signal.

The electrically controllable valves 410 output state information signals 73 which indicate an operational parameter of the electrically controllable valves. For example, in some embodiments, the state information signals 73 indicate a state or condition of the electrically controllable valves (e.g., open or closed). In some embodiments, the state information signals 73 indicate an amount or extend that the electrically controllable valves are open (e.g., a percentage open, or the like).

The state information signals 73 are received by the control circuitry 60. In some embodiments, the state information signals 73 are output to the communication hub 64, which may process the state information signals 73 or otherwise route the state information signals 73 to the controller 62.

In some embodiments, the controller 62 determines which of the plurality of electrically controllable valves 410 to open or close based on the output signals 71 from the chemical sensor 38 and based on the state information signals 73 which indicate a current state of the electrically controllable valves 410. For example, if the output signals 71 from the chemical sensor 38 indicate that an amount of water in the chemical mixture 20 of a particular one of the tanks 112*a*-112*d* (see FIG. 3) is below a target range or a target threshold, the controller 62 may determine that additional DI water should be provided, for example, by increasing a flow of the DI water through the associated second inlet valve 124*a*-124*d*. In order to achieve the correct amount of flow of the DI water, the controller 62 may determine, based on the state information signals 73, the current amount of opening of the associated second inlet valve 124*a*-124*d*, and then determines an amount of further opening of the valve in order to provide the calculated or determined flow of DI water in order to bring the amount of DI water in the chemical mixture 20 up to the target range or threshold amount. When the amount of DI water in the chemical mixture 20 is determined to be within the target range or at threshold amount (e.g., based on sensing by the chemical sensor 38), the controller 62 may control the valve to be closed or to Communications between the chemical sensor 38, the controller 62, the communication hub 64, the DAQ circuitry 66, and the electrically controllable valves 410 may be provided via any suitable communications link or communications protocol, including, for example, via one or more local area networks, wireless networks, dedicated lines, intranets, the Internet, and the like.

In some embodiments, the chemical sensor 38 communicates with the controller 62 via RS232, which is a serial communication standard. In some embodiments, the controller 62 communicates with the communication hub 64 via an Ethernet connection, and the communication hub 64 communications with the DAQ circuitry 66 via an Ethernet connection.

In some embodiments, the electrically controllable valves 410 are controlled to be opened or closed until a particular amount of water or moisture content within the chemical mixture 20 is reached. The particular amount of water or moisture content may be specified, for example, by a processing recipe or the like. The particular amount of water or moisture content may be monitored by the chemical sensor 38, and when the particular amount is reached, one or more of the electrically controllable valves 410 may be closed.

Figure 5:
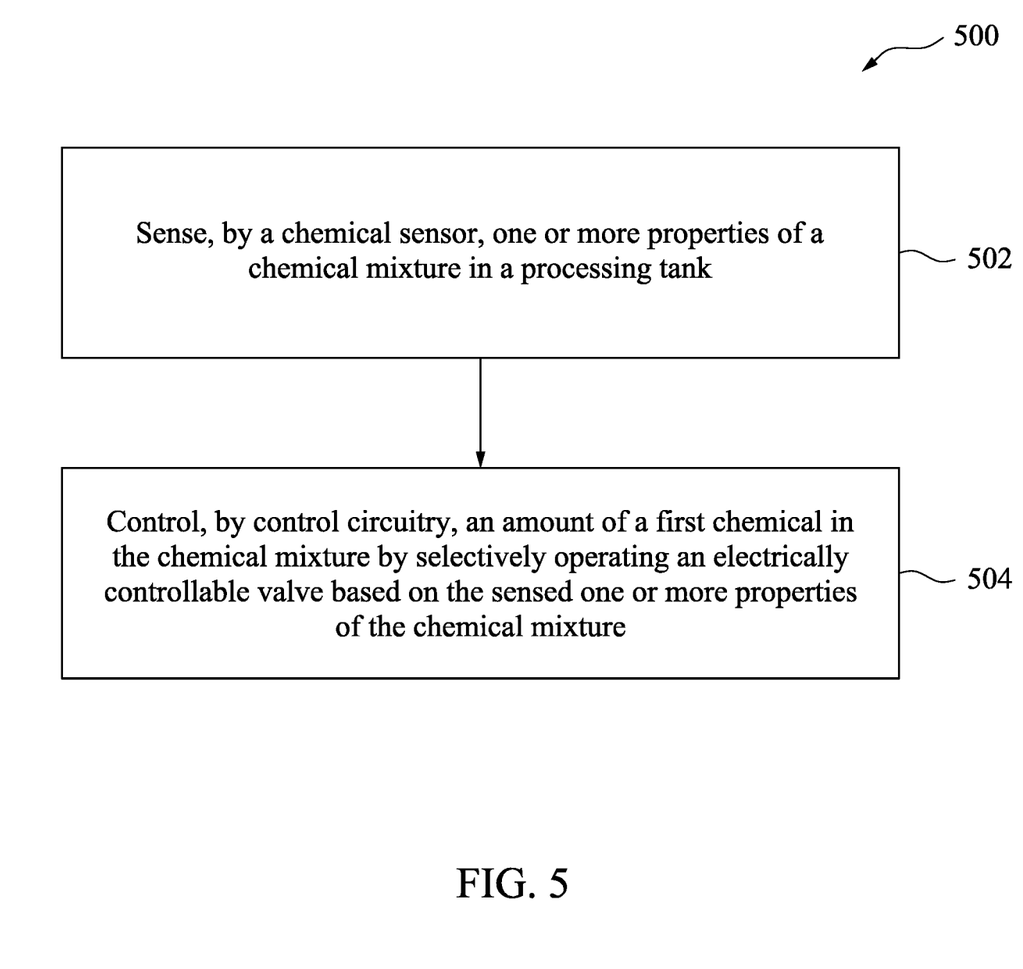
FIG. 5 is a flowchart illustrating a method of automatically controlling an amount of a chemical in a chemical mixture in a processing tank, in accordance with some embodiments.

FIG. 5 is a flowchart 500 illustrating a method of automatically controlling an amount of a chemical in a chemical mixture in a processing tank, in accordance with one or more embodiments of the present disclosure.

At 502, the method includes sensing one or more properties of a chemical mixture 20 in a processing tank 12. The sensing is performed, for example, by a chemical sensor 38. The chemical mixture 20 may be any chemical mixture as previously described herein. In some embodiments, the sensed one or more properties of the chemical mixture 20 includes an amount or concentration of a first chemical in the chemical mixture 20.

At 504, the method includes controlling, by control circuitry 60, an amount a first chemical in the chemical mixture 20 by selectively operating an electrically controllable valve 410 based on the sensed one or more properties of the chemical mixture 20. In some embodiments, the control circuitry 60 determines an operational state of the electrically controllable valve 410 and selectively operates the electrically controllable valve 410 based on the determined operational state of the electrically controllable valve 410.

Embodiments of the present disclosure provide several advantages. For example, embodiments provided herein can reduce or eliminate human operation of valves in order to adjust an amount of water or moisture content in the chemical mixture. This saves significant time and labor costs associated with human operation. Moreover, embodiments of the present disclosure facilitate a more stable flow of the correct amount of water into the chemical mixture, as the water or moisture content may be continually monitored and adjusted by automatic operation of the electrically controllable valves. The concentration and control of water or moisture into the chemical mixture is also stable and easily controlled due to the monitoring and automatic adjustment of the electrically controllable valves. Since the monitoring operation is automatically performed by the system of this disclosure, the monitor frequency can be precisely and easily adjusted through the system. Moreover, cross-pollution between processing tanks is reduced as each of the processing tanks may have one or more associated electrically controllable valves which may be independently operated in order to adjust or optimize the chemical mixture in each of the processing tanks.

Embodiments of the present disclosure further reduce defects in semiconductor structures (e.g., semiconductor wafers) that are processed within the processing tanks. Some precisions of chemical concentrations are very important in the manufacturing processes. As long as the critical concentration shifts slightly, it may cause peeling or pits (fall-on) defect(s) on the wafer and results in a production scrap event. For example, water or moisture content within a chemical mixture (e.g., within an etch residue remover and/or a photoresist stripper) can damage the semiconductor wafer if it is not precisely controlled. For example, water or moisture content that is outside of an acceptable range (which may be dependent upon a particular process recipe, or the like) may cause peeling or pitting defects on the wafer, which may result in scrapping of the wafer. This disadvantageously increases costs for the production of semiconductor devices. However, embodiments of the present disclosure reduce such defects as the water or moisture content within the chemical mixture may be precisely monitored and automatically controlled.

The present disclosure provides, in various embodiments, semiconductor processing systems and methods having an electrically controllable valve which is automatically controllable to adjust an amount or concentration of a chemical (such as water) in a chemical mixture within a processing tank.

The system saves space and operation more easily.

According to one embodiment, a semiconductor processing system is provided that includes a processing configured to contain a chemical mixture including a first chemical. A chemical sensor is configured to sense one or more properties of the chemical mixture. The system further includes an electrically controllable valve that is configured to adjust an amount of the first chemical in the chemical mixture based on the sensed one or more properties of the chemical mixture.

According to another embodiment, a method is provided that includes sensing, by a chemical sensor, one or more properties of a chemical mixture in a processing tank. The method further includes controlling, by control circuitry, an amount of a first chemical in the chemical mixture by selectively operating an electrically controllable valve based on the sensed one or more properties of the chemical mixture.

According to yet another embodiment, a system is provided that includes a plurality of processing tanks configured to contain a chemical mixture. A chemical sensor is configured to sense one or more properties of the chemical mixture in each of the processing tanks. A plurality of first inlet valves are included in the system, and each of the first inlet valves is coupled between a supply of a first liquid and an interior of a respective processing tank. Control circuitry is communicatively coupled to the chemical sensor and the plurality of first inlet valves, and the control circuitry is configured to automatically adjust an amount of the first liquid in the chemical mixture by selectively operating the plurality of first inlet valves based on the sensed one or more properties of the chemical mixture.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor processing system, comprising:
a plurality of processing tanks configured to contain a chemical mixture including a first chemical, the plurality of processing tanks in communication with a recirculation loop;
a chemical sensor in communication with the recirculation loop and configured to sense one or more properties of the chemical mixture;

an electrically controllable valve configured to adjust an amount of the first chemical in the chemical mixture based on the sensed one or more properties of the chemical mixture;

a plurality of inlet valves and a plurality of outlet valves each communicatively coupled to the recirculation loop, one of the plurality of inlet valves communicatively coupled to an inlet of a respective one of the plurality of processing tanks and one of the plurality of outlet valves communicatively coupled to an outlet of the respective one of the plurality of processing tanks;

a pump communicatively coupled with the plurality of outlet valves and the plurality of inlet valves and positioned between the plurality of outlet valves and the plurality of inlet valves, the pump configured to pump a flow of the chemical mixture from the interior of the plurality of processing tanks through the respective plurality of outlet valves, through the chemical sensor and back into the interior of the plurality of processing tanks through the respective inlet valves; and control circuitry communicatively coupled to the chemical sensor and the plurality of inlet valves and the plurality of outlet valves, the control circuitry configured to automatically adjust an amount of the first chemical in the chemical mixture by selectively operating the plurality of inlet valves based on the sensed one or more properties of the chemical mixture and to maintain flow of the chemical mixture through the plurality of processing tanks until the chemical mixture in each of the plurality of processing tanks is homogeneous with the chemical mixture in the other plurality of processing tanks.

2. The semiconductor processing system of claim 1, wherein the sensed one or more properties of the chemical mixture includes a concentration of the first chemical in the chemical mixture.

3. The semiconductor processing system of claim 2, wherein the first chemical is water.

4. The system of claim 1, wherein the control circuitry is communicatively coupled to the chemical sensor, the control circuitry configured to control the electrically controllable valve based on the sensed one or more properties of the chemical mixture.

5. The system of claim 4, wherein the control circuitry is communicatively coupled to the electrically controllable valve and configured to receive a state information signal indicative of a condition of the electrically controllable valve, the control circuitry further configured to control the electrically controllable valve based on the state information signal.

6. The system of claim 4, wherein the control circuitry is configured to automatically control the electrically controllable valve to maintain a concentration of the first chemical in the chemical mixture within a selected range, and the electrically controllable valve is configured to adjust an amount of the first chemical flowing into the chemical mixture.

7. The system of claim 4, wherein the control circuitry is configured to automatically control the electrically controllable valve to maintain a concentration of the first chemical in the chemical mixture within 1% deviation of a threshold concentration.

8. The system of claim 1, wherein the electrically controllable valve includes:

a first inlet valve communicatively coupled between a supply of a first liquid and an interior of one of the processing tanks; and a second inlet valve communicatively coupled between a supply of a second liquid and the interior of the processing tanks.

9. The system of claim 8, wherein the chemical sensor is communicatively coupled between the plurality of outlet valves and the plurality of inlet valves.

10. The system of claim 8, wherein the recirculation loop further includes:

a heater communicatively coupled between the plurality of outlet valves and the plurality of inlet valves, the heater configured to heat the flow of the chemical mixture; and a filter coupled between the plurality of outlet valves and the plurality of inlet valves, the filter configured to filter the flow of the chemical mixture.

11. The system of claim 8, wherein the first liquid includes at least one of an etch residue remover or a photoresist stripper, and the second liquid is water.

12. A method, comprising:

forming a chemical mixture containing a first chemical in a plurality of processing tanks by introducing the first chemical into each of the plurality of processing tanks;

flowing the chemical mixture from each of the plurality of processing tanks to a recirculation loop via a respective outlet valve in communication with a respective one of the plurality of processing tanks;

sensing, by a chemical sensor communicatively coupled to the recirculation loop, one or more properties of the chemical mixture flowing through the recirculation loop;

controlling, by control circuitry, an amount of the first chemical in the chemical mixture by selectively operating an electrically controllable valve based on the sensed one or more properties of the chemical mixture;

flowing the chemical mixture from the chemical sensor through the recirculation loop;

returning the chemical mixture to each of the plurality of processing tanks via a respective inlet valve in communication with a respective one of the plurality of processing tanks and the recirculation loop; and homogenizing the chemical mixture by continuing to flow the chemical mixture through the recirculation loop and the plurality of processing tanks.

13. The method of claim 12, further comprising:

determining, by the control circuitry, an operational state of the electrically controllable valve, wherein the selectively operating the electrically controllable valve includes selectively operating the electrically controllable valve based on the determined operational state of the electrically controllable valve.

14. The method of claim 12, wherein the controlling the amount of the first chemical in the chemical mixture includes maintaining a concentration of the first chemical in the chemical mixture within a selected range, and the electrically controllable valve is configured to adjust an amount of the first chemical flowing into the chemical mixture.

15. The method of claim 12, wherein the controlling the amount of the first chemical in the chemical mixture includes maintaining a concentration of the first chemical in the chemical mixture within 1% deviation of a threshold concentration.

16. The method of claim 12, wherein the selectively operating the electrically controllable valve includes selectively operating at least one of: a respective first inlet valve communicatively coupled between a supply of a first liquid and an interior of a respective one of the plurality of processing tanks; a respective second inlet valve communicatively coupled between a supply of a second liquid and the interior of a respective one of the plurality of processing tanks; an respective outlet valve communicatively coupled to the interior of the a respective one of the plurality of processing tanks; the respective inlet valve communicatively coupled to the interior of the respective one of the plurality of processing tanks; or a drain valve communicatively coupled between the interior of the respective one of the plurality of processing tanks and a drain conduit.

17. A system, comprising:
   a plurality of processing tanks configured to contain a chemical mixture;
   a recirculation loop in fluid communication with each of the plurality of processing tanks;
   a chemical sensor in fluid communication with the recirculation loop and configured to sense one or more properties of the chemical mixture in each of the plurality of processing tanks;
   a plurality of first inlet valves, each of the first inlet valves coupled between a supply of a first liquid and an interior of a respective processing tank of the plurality of processing tanks;
   a plurality of outlet valves, each of the outlet valves coupled between a respective processing tank of the plurality of processing tanks and the chemical sensor, the plurality of outlet valves in communication with the recirculation loop;
   a pump communicatively coupled with the plurality of outlet valves and a plurality of inlet valves and positioned between the plurality of outlet valves and the plurality of inlet valves, the pump configured to pump a flow of the chemical mixture from the interior of the plurality of processing tanks through the respective plurality of outlet valves, through the chemical sensor and back into the interior of the plurality of processing tanks through the respective plurality of inlet valves; and
   control circuitry communicatively coupled to the chemical sensor and the plurality of first inlet valves, the control circuitry configured to automatically adjust an amount of the first liquid in the chemical mixture by selectively operating the plurality of first inlet valves based on the sensed one or more properties of the chemical mixture and to maintain flow the chemical mixture through the plurality of processing tanks until the chemical mixture in each of the plurality of processing tanks is homogeneous with the chemical mixture in the other plurality of processing tanks.

18. The system of claim 17, further comprising:
   a plurality of second inlet valves, each of the second inlet valves coupled between a supply of a second liquid and the interior of a respective processing tank of the plurality of processing tanks.

19. The system of claim 18, wherein the first liquid is water, and the second liquid includes at least one of an etch residue remover or a photoresist stripper.

20. The system of claim 17, wherein the control circuitry is configured to automatically control the plurality of first inlet valves to maintain a concentration of the first chemical in the chemical mixture within a selected range.

* * * * *